United States Patent [19]

Andoh

[11] Patent Number: 5,461,344
[45] Date of Patent: * Oct. 24, 1995

[54] PHASE LOCK LOOP FREQUENCY SYNTHESIZER

[75] Inventor: Akira Andoh, Hyogo, Japan

[73] Assignee: Mitsubishi Denki Kabushiki Kaisha, Tokyo, Japan

[*] Notice: The portion of the term of this patent subsequent to Apr. 21, 2009 has been disclaimed.

[21] Appl. No.: 144,523

[22] Filed: Nov. 2, 1993

[30] Foreign Application Priority Data

Nov. 10, 1992 [JP] Japan .................................. 4-323810

[51] Int. Cl.$^6$ .................................................. H03L 7/187
[52] U.S. Cl. ............................ 331/1 A; 331/14; 331/25; 331/17; 327/105; 327/107; 327/156; 327/157; 327/159
[58] Field of Search ....................... 331/14, 16, 17, 331/25, 1 A; 327/105, 107, 156, 157, 159

[56] References Cited

U.S. PATENT DOCUMENTS

| 4,980,652 | 12/1990 | Tarusawa et al. ................. 331/1 A |
| 5,036,295 | 7/1991 | Kamitani ............................. 331/10 |
| 5,107,220 | 4/1992 | Andoh .................................. 328/14 |
| 5,170,130 | 12/1992 | Ichihara ............................. 328/155 |
| 5,258,724 | 11/1993 | Tanis et al. ....................... 331/1 A |

Primary Examiner—Robert J. Pascal
Assistant Examiner—Arnold Kinkead
Attorney, Agent, or Firm—Rothwell, Figg, Ernst & Kurz

[57] ABSTRACT

A phase lock loop frequency synthesizer is applied to radio communication devices or the like, in order to reduce frequency error at a time of frequency changing, and considerably reduce a frequency changing time. At the time of frequency changing, a first loop filter performs frequency coarse adjustment, and charges or discharges a capacitor in a second loop filter to voltage corresponding to target frequency. Further, a controller feeds a voltage controlled oscillator with a frequency fine control data so as to output the target frequency, and controls a loop filter in a phase lock loop to be switched over from the first loop filter to the second loop filter.

4 Claims, 8 Drawing Sheets

PHASE LOCK LOOP FREQUENCY SYNTHESIZER

BACKGROUND OF THE INVENTION

1. Field of the Invention

The present invention relates to a frequency synthesizer mainly for use in radio communication devices or the like, in particular to a phase lock loop frequency synthesizer which can perform high speed changing of frequency.

2. Description of the Prior Art

FIG. 1 is a block diagram showing a conventional phase lock loop frequency synthesizer. In FIG. 1, reference numeral 201 means a voltage controlled oscillator (hereinafter referred to as VCO), 202 means a variable frequency divider to divide oscillation frequency of the VCO 201, 203 is a reference frequency oscillator (reference oscillator), 204 is a variable frequency divider to divide oscillation frequency of the reference oscillator 203, 205 is a phase comparator into which output from the variable frequency dividers 202 and 204 are input, 206 is a charging pump circuit, and 207 is a loop filter.

A description will now be given of the operation. The phase comparator 205 compares phase of the output from the variable frequency divider 202 dividing an output signal of the VCO 201 by N with phase of the output from the variable frequency divider 204 dividing a reference signal from the reference frequency oscillator 203 by M so as to output the phase difference as a pulse signal. The charging pump circuit 206 converts the pulse signal into an analog value. The phase difference signal passes through the loop filter 207 defining a characteristic of the loop, and thereafter serves as control voltage for the VCO 201. The VCO 201 generates an output signal having frequency corresponding to the control voltage. In such a way, control is made to reduce the phase difference between two divided frequencies so as to perform phase lock. The output signal serves as output of the frequency synthesizer, and is fed into the variable frequency divider 202. In a stationary state, output frequency of the frequency synthesizer is N times output frequency of the variable frequency divider 204. Further, the two divided frequencies are in phase with each other, and frequency stability of the VCO 201 is maintained to be identical with frequency stability of the reference frequency oscillator 203.

In case the frequency synthesizer is applied to a radio communication device or the like, it is necessary to change the frequency at a high speed. In many techniques to realize the high speed changing, the inventor has been disclosed an available technique in Japanese Patent Application Laid-Open No. 4-047812(1992), that is, has been disclosed the loop filter 207 having a configuration as shown in FIG. 2.

In FIG. 2, reference numeral 301 means an input terminal of the loop filter 207, 302 means an output terminal, 303 is a loop filter, 304 is another loop filter, 305 is still another loop filter, 3031 and 3032 are resistors serving as components of the loop filter 303, 3033 is a capacitor serving as the component of the loop filter 303, 3041 and 3042 are resistors serving as components of the loop filter 304, and 3043 is a capacitor serving as the component of the loop filter 304.

Further, reference numerals 3051 and 3052 mean resistors serving as the components of the loop filter 305, 3053 means a capacitor serving as the component of the loop filter 305, reference numerals 307 to 315 are switches, and 316 is a voltage follower amplifier having high input impedance. In addition, FIG. 3 is a timing diagram showing a signal condition and a mode of each circuit portion corresponding to frequency changing process in the loop filter 207.

A description will now be given of the operation. In a phase lock loop (hereinafter referred to as PLL) employing a lag-lead type of loop filter as shown in FIG. 2, a loop gain K, natural angular frequency $\omega n$, and a damping factor $\zeta$ can be expressed as follows:

$$K = Kv \cdot K\phi / N$$

$$\omega n = K/(\tau_1 + \tau_2)$$

$$\zeta = (\omega n/2)\{(1/K) + \tau_2\}$$

where

Kv: sensitivity of the VCO $K\phi$: sensitivity of the phase comparator

N: the dividing number of the frequency divider, and $$\tau_1 = R_1 C, \ \tau_2 = R_2 C$$

Next, when a step frequency variation of $\Delta f$ occurs in the PLL, a frequency and phase drawing time (a loop response time) T is expressed by the sum of a frequency lock time ts and a phase lock time tp as follows (V. Manassewitsch "Frequency Synthesizers Theory and Design" Chap. 5, John Wiley and Sons, Inc., 1987):

$$T = ts + tp$$

In the expression, $$ts = 4(\Delta f/N)^2 / Bn^3$$

where Bn is a noise band, and Bn can be expressed as follows:

$$Bn = (\omega n/2)\{\zeta + (1/4\zeta)\}$$

Further, $$tp = (2/K - \cos \epsilon_{ss}) \cdot \log_e(2/\gamma_{lock})$$

where $\epsilon_{ss}$ is $\Delta\omega/K$, and $\gamma_{lock}$ is a stable phase error. As will be obvious from the facts, the loop gain K, and $\tau_1$, $\tau_2$ may be appropriately switched in order to effectively reduce the frequency and phase drawing time (the loop response time).

A description will now be given of a technique to cause the loop gain and $\tau_1$, $\tau_2$ serving as loop time constants to be switched over at a time of frequency changing. A loop filter portion shown in FIG. 2 includes three loop filters 303, 304, and 305. At the time of frequency changing, in the first step, a dividing ratio $M_1$ is used for the variable frequency divider 204 and a dividing ratio $N_1$ is used for the variable frequency divider 202. In the second step, a dividing ratio $M_2$ is used for the variable frequency divider 204 and a dividing ratio $N_2$ is used for the variable frequency divider 202, and in the third step, dividing ratios $M_3$ and $N_3$ are used.

The loop filter 303 corresponds to the dividing ratios $N_1$, $M_1$, and is set to have appropriate values of $\tau_{11}$, $\tau_{12}$. Further, the loop filter 304 corresponds to the dividing ratios $N_2$, $M_2$, and is set to have appropriate loop time constants of $\tau_{21}$, $\tau_{22}$.

In addition, the loop filter 305 corresponds to the diving ratios $N_3$, $M_3$, and is set to have appropriate loop time constants of $\tau_{31}$, $\tau_{32}$. Further, the loop filter 305 is provided with a low pass filter to damp a spurious output, and in the low pass filter, resistance of resistors 3054, 3056 and capacitance of capacitors 3055, 3057 are determined so as to optimize a characteristic at a stationary time.

Next, a description will now be given of the operation at the time of frequency changing. First, the PLL is set to have the dividing ratios of $N_3$ and $M_3$, and is in the stationary state for frequency $f_0$. In this condition, the switch 314 is in an ON state, and the switches 307 and 312 are in an OFF state. Therefore, the loop filter 305 is operated, and the capacitors in the loop filters 303,304 are charged to follow an output from the loop filter 305, that is, a value equivalent to the control voltage of the VCO 201.

At the same time of setting the dividing ratios $N_1$ and $M_1$, the switch 307 is turned ON and the switch 304 is turned OFF, and the switch 312 is left OFF. In this step, the loop filter 303 is operated, and the capacitors in the loop filters 304, 305 are charged by the voltage follower amplifier 316 to follow a variation in the control voltage of the VCO 201. At this time, $\tau_1 = R_{3031} \cdot C_{3033}$ and $\tau_2 = R_{3032} \cdot C_{3033}$ are determined so as to have appropriate values for the dividing ratios $N_1$, $M_1$, and converge at the frequency $f_1$ in a short convergence time. A time required for the convergence is defined as $\tau_1$.

Subsequently, at the same time of setting the dividing ratios $N_2$ and $M_2$, the switch 312 is turned ON and the switch 307 is turned OFF, and the switch 314 is left OFF. In this step, the loop filter 304 is operated, and the capacitors in the loop filters 303, 305 are charged by the voltage follower amplifier 316 to follow the variation in the control voltage of the VCO 201. At this time, $\tau_1 = R_{3041} \cdot C_{3043}$ and $\tau_2 = R_{3042} \cdot C_{3043}$ are determined so as to have appropriate values for the dividing ratios $N_2$, $M_2$, and converge at frequency $f_2$ in a short convergence time. A time required for the convergence is defined as $t_2$.

Next, at the same time of setting the dividing ratios $N_3$ and $M_3$, the switch 314 is turned ON and the switch 312 is turned OFF, and the switch 307 is left OFF. In this step, the loop filter 305 is operated, and the capacitors in the loop filters 303,304 are charged by the voltage follower amplifier 316 to follow the variation in the control voltage of the VCO 201. At this time, $\tau_1 = R_{3051} \cdot C_{3053}$ and $\tau_2 = R_{3052} \cdot C_{3053}$ are determined so as to have appropriate noise bands for the dividing ratios $N_3$, $M_3$ in the stationary state. Further, the loop filter 305 incudes the low pass filter having $R_{3054}$, $C_{3053}$, $R_{3056}$, and $C_{3057}$ in order to provide an appropriate spurious attenuation, resulting in an appropriate stationary state. A time period required for convergence from the frequency $f_2$ to the frequency $f_3$ is defined as $t_3$.

As a result, $t_1 + t_2 + t_3$ is obtained as a frequency changing time from the frequency $f_0$ to the frequency $f_3$, and is greatly improved as compared with a case of changing by using the frequency dividing ratios $N_3$, $M_3$ exclusively. FIG. 3 shows a timing diagram illustrating the changing process.

As set forth above, in the phase lock loop frequency synthesizer which has been disclosed by the inventor, it is possible to reduce the frequency changing time, and perform a sufficiently high speed operation. However, in the boundaries between the first step and the second step and between the second step and the third step of frequency changing, there are respectively errors for the target frequencies $f_2$, $f_3$ so that a time to draw the frequency is necessary. Hence, in the above configuration, there is a limitation in reduction of the entire frequency changing time.

SUMMARY OF THE INVENTION

In view of the foregoing, it is an object of the present invention to further improve the above configuration so as to provide a phase lock loop frequency synthesizer in which a frequency changing time can be further reduced.

According to one aspect of the present invention, for achieving the above-mentioned objects, there is provided a phase lock loop frequency synthesizer in which a controller varies control voltage to a frequency fine control terminal of a voltage controlled oscillator (VCO) to shift oscillation frequency to target frequency such that a first loop filter and a second loop filter are switched over, and frequency dividing ratios of a reference frequency divider and a comparison frequency divider are switched over, and the reference frequency divider and the comparison frequency divider are reset so as to perform initial phase matching.

In the phase lock loop frequency synthesizer, capacitors respectively mounted in the first and second loop filters are charged, and the charging voltage is set to be identical with the control voltage of the voltage controlled oscillator, and a fine control data is input into the frequency fine control terminal of the voltage controlled oscillator so as to cause the loop filters to be switched according to the target frequency. Further, the frequency dividing ratios of the reference frequency divider and the comparison frequency divider are switched over, and the reference frequency divider and the comparison frequency divider are reset to perform the initial phase matching so as to carry out frequency changing.

Consequently, in the phase lock loop frequency synthesizer according to one aspect of the present invention having the above configuration, it is possible to sufficiently reduce a frequency error at a time of frequency changing, and sufficiently reduce a frequency drawing time. As a result, it is possible to considerably reduce an entire frequency changing time.

According to another aspect of the present invention, there is provided a phase lock loop frequency synthesizer having a charging circuit which previously charges a capacitor of a first loop filter with voltage corresponding to a target frequency depending upon a frequency coarse control data. Thereby, the capacitor of the second loop filter is previously charged with the voltage corresponding to the target frequency.

Consequently, in the phase lock loop frequency synthesizer according to another aspect of the present invention, an auxiliary capacitor is previously charged by applying voltage adjacent to the control voltage corresponding to the target frequency, and voltage of the auxiliary capacitor is changed by a switch to be output such that a charging time for the capacitor in the loop filter is reduced. As a result, it is possible to further reduce a frequency changing time.

The above and further objects and novel features of the invention will more fully appear from the following detailed description when the same is read in connection with the accompanying drawing. It is to be expressly understood, however, that the drawings are for purpose of illustration only and are not intended as a definition of the limits of the invention.

DETAILED DESCRIPTION OF THE PREFERRED EMBODIMENTS

Preferred embodiments of the invention will now be described in detail referring to the accompanying drawings.

Embodiment 1

Figure 1:
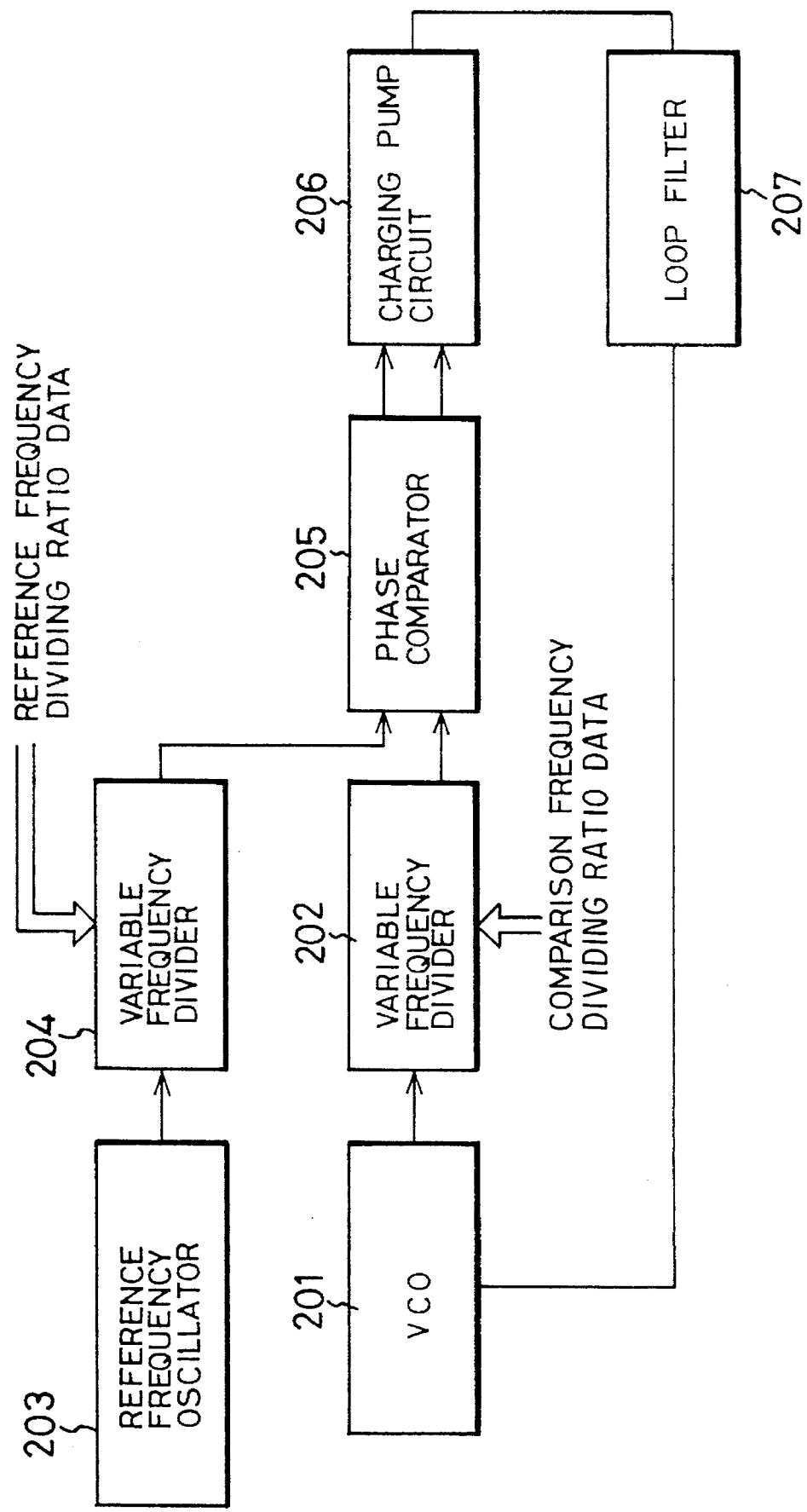
FIG. 1 is a block diagram showing a conventional phase lock loop frequency synthesizer.
Figure 2:
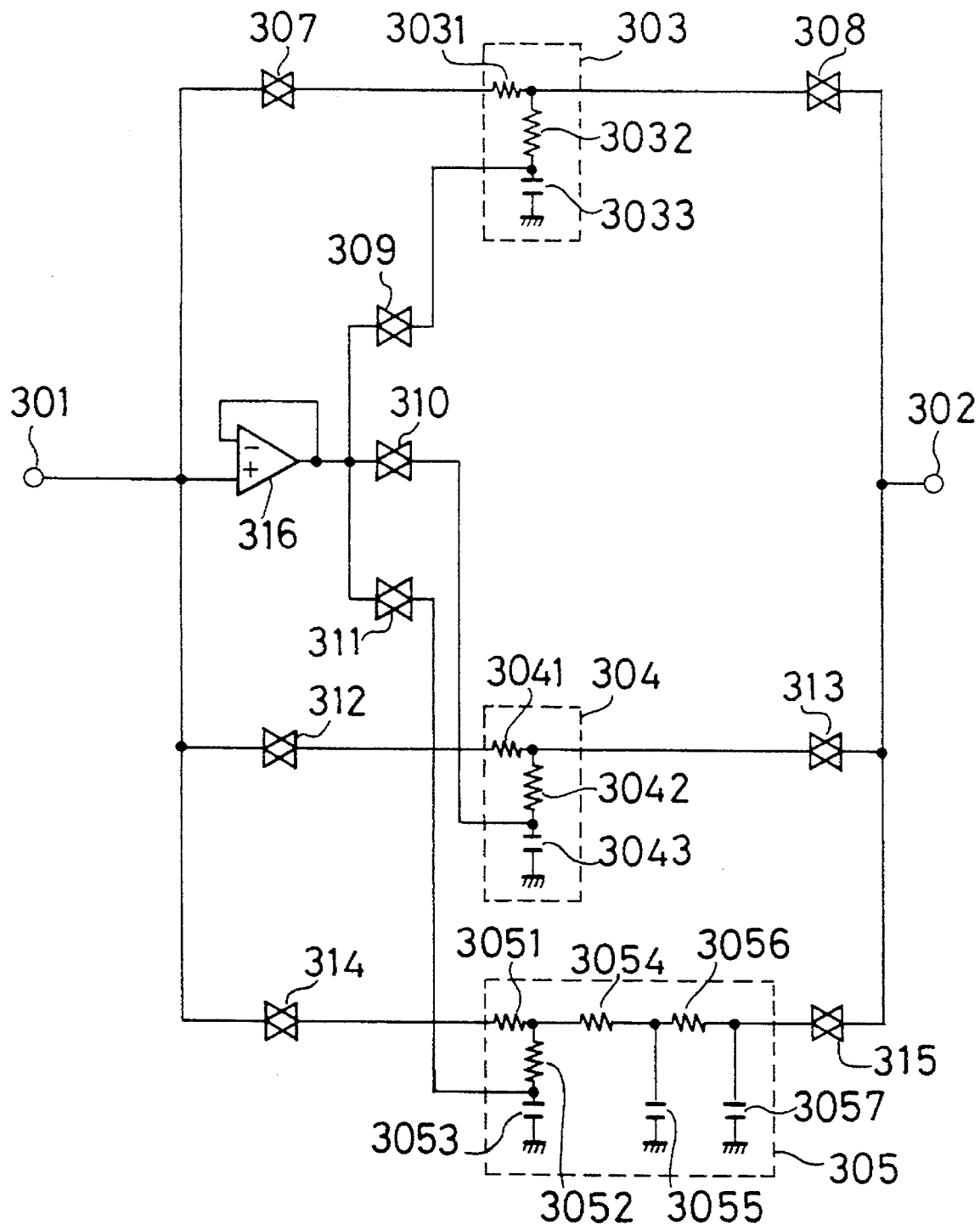
FIG. 2 is a circuit diagram showing an improved conventional loop filter in detail.
Figure 3:
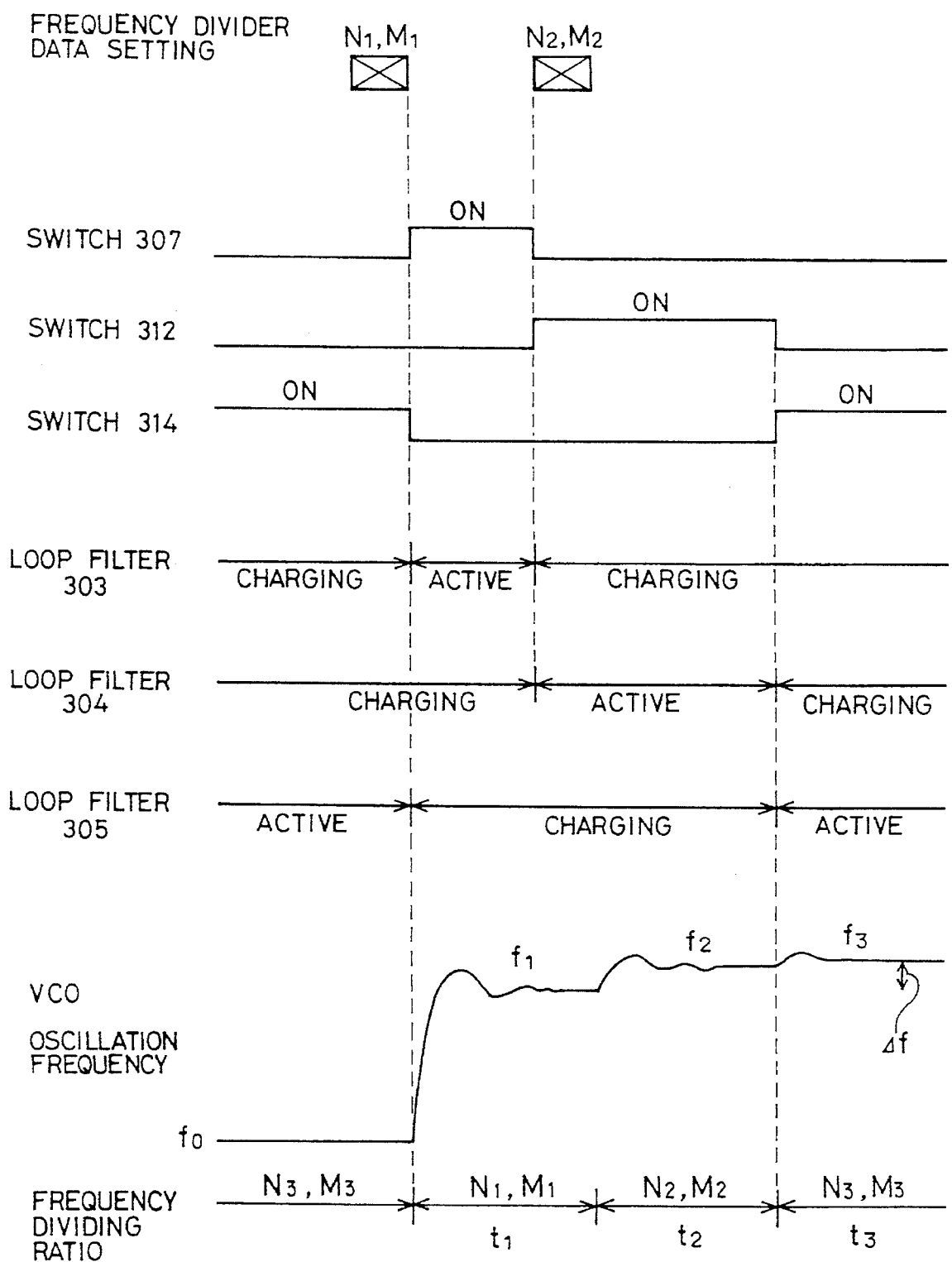
FIG. 3 is a timing diagram showing a signal and a mode of each block portion in FIG. 2.
Figure 4:
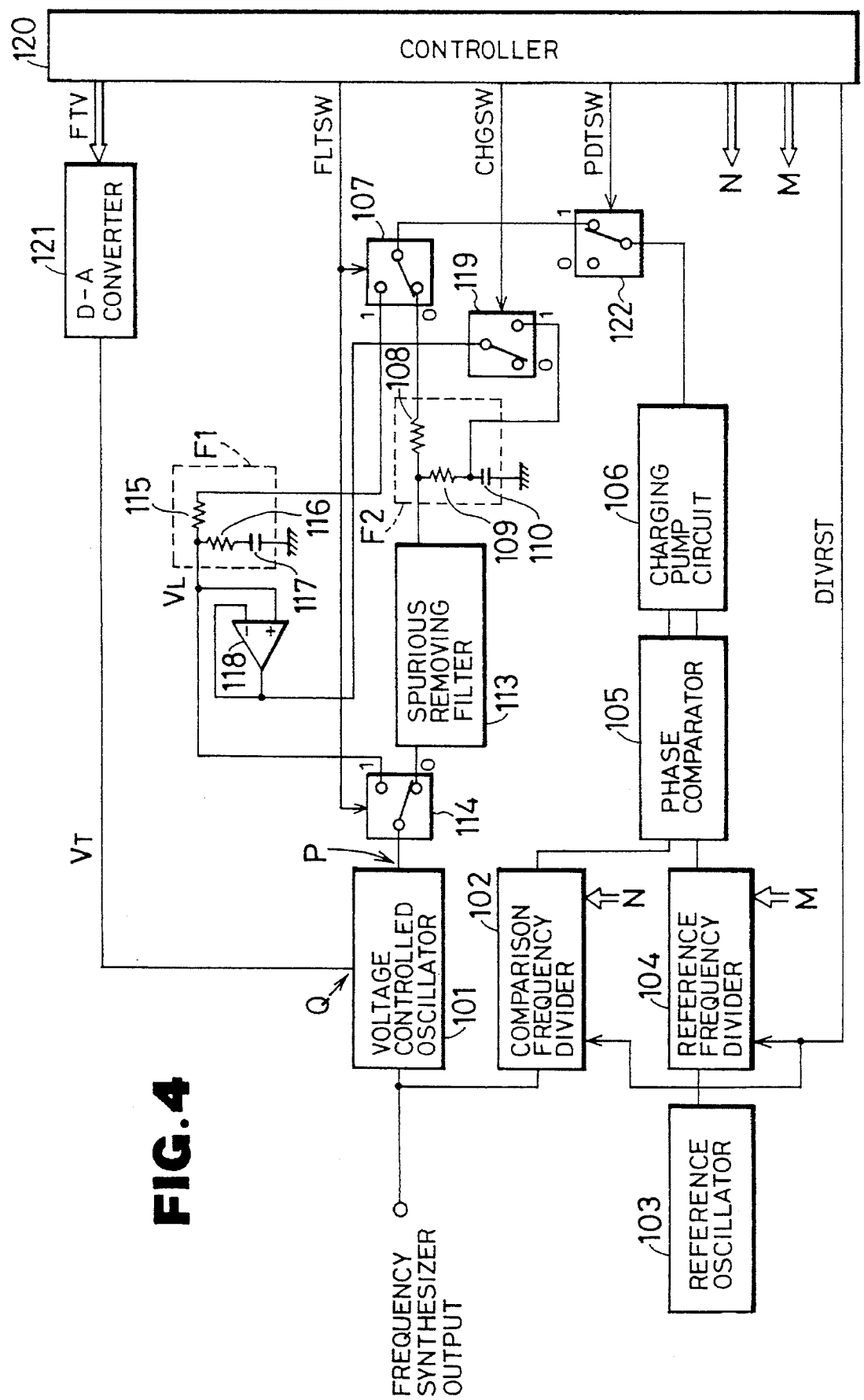
FIG. 4 is a block diagram showing a phase lock loop frequency synthesizer according to the first embodiment of the present invention.

A description will now be given of one embodiment of the present invention with reference to the drawings. In FIG. 4, reference numeral 101 means VCO having two frequency variable terminals, that is, a frequency control terminal P and a frequency fine control terminal Q, 102 means a variable frequency divider (hereinafter referred to as comparison frequency divider) to divide output from the VCO 101, and 103 is a reference oscillator having high frequency stability to output frequency serving as reference frequency for a frequency synthesizer. Further, reference numeral 104 means a variable frequency divider (hereinafter referred to as reference frequency divider) to divide output from the reference oscillator 103, and 105 means a phase comparator to compare phases of output from the comparison frequency divider 102 and the reference frequency divider 104 so as to output a leading signal and a lag signal.

Further, reference numeral 106 means a charging pump circuit to generate an analog signal to control the VCO 101 according to two output signals from the phase comparator 105, 122 means a switch which causes the charging pump circuit 106 to make or break contact with a first loop filter F1 and a second loop filter 2 according to a switch changing signal PDTSW from a controller 120, and 107 is a switch which causes the output from the charging pump circuit 106 to be switched over to the first loop filter F1 or the second loop filter F2 according to a switch changing signal FLTSW from the controller 120.

In addition, reference numerals 108 and 109 mean resistors serving as components of the second loop filter F2, 110 means a capacitor serving as the component of the second loop filter F2, 113 is a spurious removing filter, 114 is a switch connected to the frequency control terminal P of the VCO 101 so as to cause the control voltage to be changed, 115 and 116 are resistors serving as components of the first loop filter F1, and 117 is a capacitor serving as the component of the first loop filter F1. Further, reference numeral 118 is a voltage follower to receive voltage from the first loop filter F1 so as to charge the capacitor 110. In case the capacitor 110 has voltage higher than the charging voltage of the capacitor 117, the capacitor 110 performs a discharging operation. In the following discussion, though a description will be given of the charging operation of the capacitor 110, the capacitor 110 may discharge.

Reference numeral 119 means a switch to connect output from the voltage follower 118 to the capacitor 110 in the second loop filter F2 according to a switch changing signal CHGSW from the controller 120, 120 means a controller to output a comparison frequency dividing data N, a reference frequency dividing data M, a frequency fine control data FTV of the VCO 101, and other switch changing signals. Further, reference numeral 121 means a D-A converter to convert the frequency fine control data FTV to an analog signal, and 122 means a switch to connect the output of the charging pump circuit 106 to the switch 107 according to the switch changing signal PDTSW from the controller 120.

The loop filter F1 is used at a time of frequency changing, and the loop filter F2 is used at a stationary time after the frequency changing.

A description will now be given of the operation with reference to a timing diagram shown in FIG. 5 and a characteristic diagram shown in FIG. 6. Since a relation between a loop response time and a loop gain is maintained as discussed in the description of the prior art, a description will now be given of a frequency fine control operation. As one example, it is assumed that output of the frequency synthesizer is in a frequency range of 914.040 to 938.970 MHz, a frequency setting step being 30 KHz, comparison frequency (frequency input into the phase comparator) in the first step being 120 KHz, the comparison frequency in the second step being 30 KHz, and frequency of the reference oscillator 103 being 14.4 MHz.

Channel numbers 1 to 832 are assigned to frequencies at each 30 KHz starting from 914.040 MHz in the output frequency of the frequency synthesizer in sequential order. For example, when a channel 1 is switched over to a channel 832, in the first step, a frequency dividing ratio of the reference frequency divider 104 is set to 1/120, and a frequency dividing ratio of the comparison frequency divider 102 is set to 1/7825. Thus, frequency to be compared in the phase comparator 105 is set to 120 KHz.

Before the frequency changing, the switch changing signal CHGSW is "0." Accordingly, the switch 119 sets the voltage follower 118 in a condition to break contact with the second loop filter F2. As shown in FIG. 5, the controller 120 sets the switch changing signal FLTSW to "1" and sets the switch changing signal PDTSW to "0." The switch 114 connects the VCO 101 to the first loop filter F1. Then, the switch 122 sets the output from the charging pump circuit 106 in a suspended condition, resulting in a condition where the phase lock loop is broken. In this condition, the controller 120 feeds the reference frequency divider 104 with the reference frequency dividing data $M_1(=1/120)$, and feeds the comparison frequency divider 102 with the comparison frequency dividing data $N_1(=1/7825)$. Further, the controller 120 feeds a reset signal to the respective frequency dividers so as to set a frequency dividing data.

Subsequently, the controller 120 set the switch changing signal PDTSW to "1." Accordingly, the switch 122 is closed, and the phase lock loop is in a closing condition. That is, it is possible to establish the loop including the phase comparator 105, the charging pump circuit 106, the first loop filter F1, the VCO 101, and the comparison frequency divider 102, and achieve phase lock corresponding to a characteristic of the first loop filter F1. In this step, the oscillation frequency is locked to 939.000 MHz (corresponding to the channel 833).

Further, the controller 120 sets the switch changing signal CHGSW to "1" while setting the switch changing signal PDTSW to "1." Accordingly, the switch 119 connects the voltage follower 118 to the second loop filter F2 so that the capacitor 110 forming the second loop filter F2 is charged through the voltage follower 118 by control voltage VL obtained through the first loop filter F1 having the capacitor 117.

After the voltage of the capacitor 110 reaches voltage corresponding to the target frequency, the controller 120 starts the second step control, that is, sets the switch changing signal FLTSW to "0." Since the voltage of the capacitor 110 is voltage corresponding to the target frequency, the VCO 101 is operated so as to maintain the oscillation frequency of 939.000 MHz even if the switches 107 and 114 are switched over to "0" and the second loop filter F2 is established in the phase lock loop.

Additionally, at a starting time of the second step, the controller 120 varies control voltage VT of the frequency fine control terminal Q such that the oscillation frequency of the VCO 101 is shifted by 30 KHz toward lower frequency. As a result, it is possible to match the oscillation frequency of the VCO 101 to frequency adjacent to 938.970 MHz without variation of the voltage (which is equivalent to the voltage charged into the capacitor 110) of the frequency control terminal P of the VCO 101.

The controller 120 turns OFF the switch 122 by the switch changing signal PDTSW to open the loop, and sets the frequency dividing ratio of the reference frequency divider 104 to 1/480, and sets the frequency dividing ratio of the comparison frequency divider 102 to 1/31299. Consequently, the frequency to be compared in the phase comparator 105 is set to 30 KHz. Subsequently, the controller 120 turns ON the switch 122 by using the switch changing signal PDTSW again to close the loop, while the controller 120 resets the respective frequency dividers 102 and 104 by a reset signal DIVRST to perform initial phase matching. That is, though the oscillation frequency is matched to about 938.970 MHz because of the frequency fine control operation by the control voltage VT, correspondence of the phases is not ensured so that the initial phase matching is required.

Figure 5:
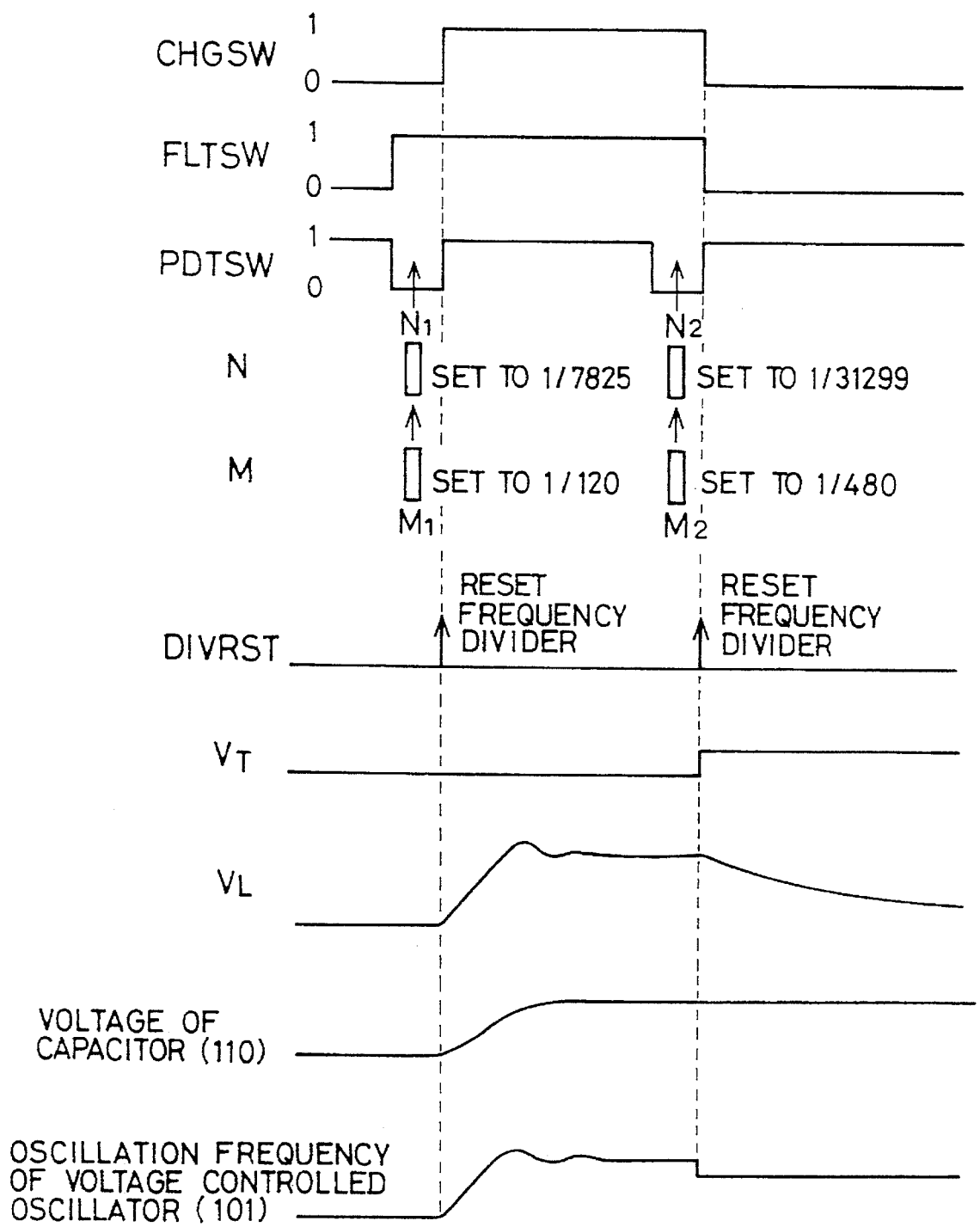
FIG. 5 is a timing diagram showing a signal and a mode of each block portion in FIG. 4.
Figure 6:
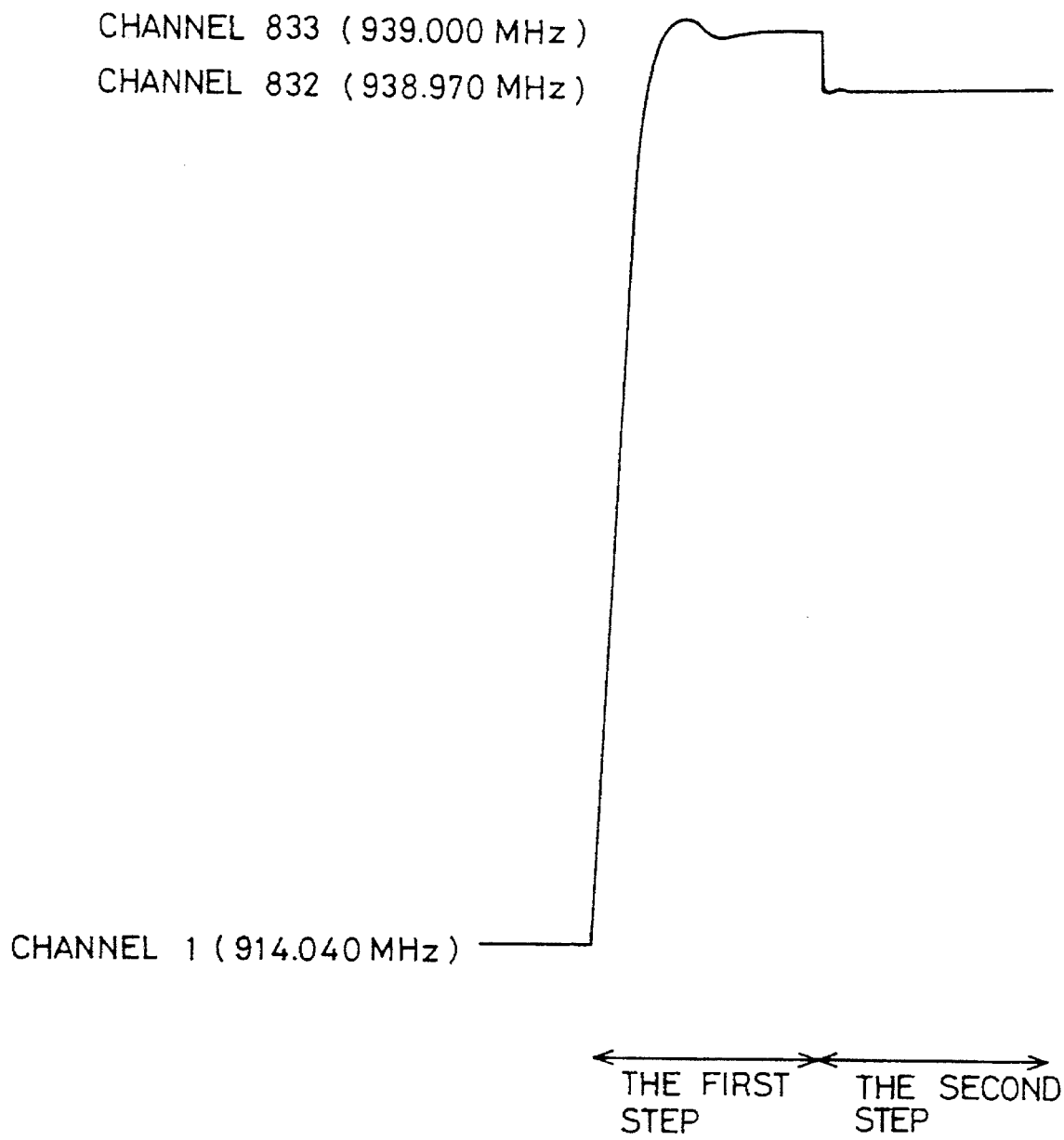
FIG. 6 is a characteristic diagram showing a frequency response characteristic of the phase lock loop frequency synthesizer shown in FIG. 4.

According to the operation as set forth above, it is possible to reduce almost all of disturbances in the frequency due to transient response in the second step as shown in FIGS. 5 and 6. In the embodiment, frequency control sensitivity of the VCO 101 is about +10 MHz/V, and frequency fine control sensitivity is about −30 KHz/V.

Embodiment 2

In the embodiment 1, initial voltage of a capacitor 117 forming a first loop filter F1 which is used in a first step is not controlled. A second loop filter F2 used in the second step (at a stationary time) includes a capacitor 110 having, to a certain extent, a large value (of about 1 µF). Therefore, a charging process (or a discharging process) of the capacitor 110 has a certain time constant which is determined by capacitance of the capacitor 110 and output impedance of a voltage follower 118. That is, in case the capacitor 110 has a large value, it is impossible to sufficiently reduce a time required for the first step due to a long charging time of the capacitor 110 even if a frequency lock time in the first step is sufficiently reduced.

Figure 7:
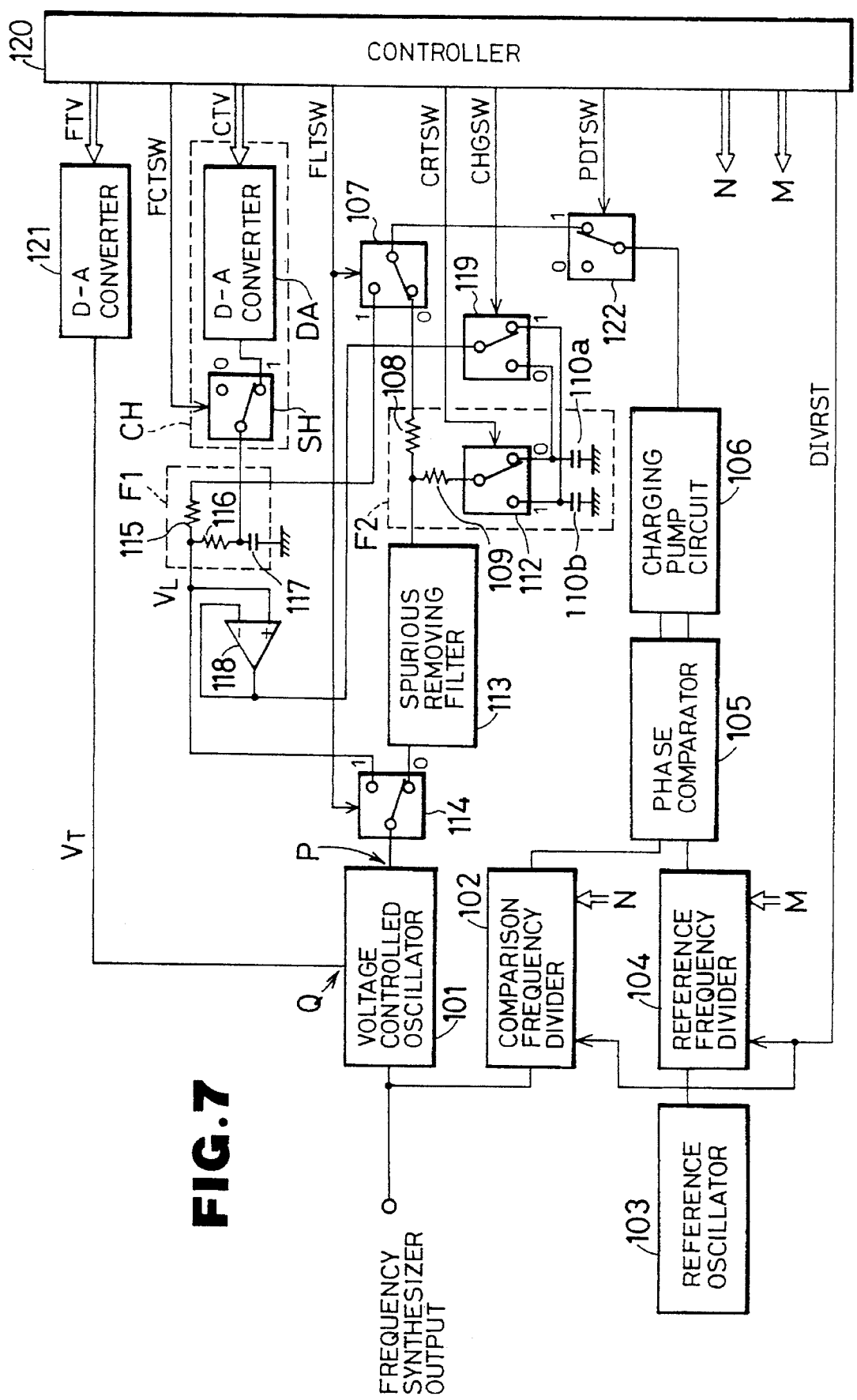
FIG. 7 is a block diagram showing a phase lock loop frequency synthesizer according to the second embodiment of the present invention.

In view of the above fact, in the embodiment 2, the voltage of the capacitor in the second loop filter F2 is controlled as shown in FIG. 7. As shown in FIG. 7, in the embodiment 2, there are provided a charging circuit CH having a D-A converter DA to convert a frequency coarse control data CTV from a controller 120 to an analog signal and a switch SH between the controller 120 and the capacitor 117. Further, two capacitors 110a and 110b are provided in the loop filter F2 used in the second step, and the capacitors are switched over by a switch 112. Other components are identical with the respective elements in the embodiment 1. The charging circuit CH and the capacitor 117 are used to previously charge the capacitor 110a or 110b used at the stationary time with voltage corresponding to frequency adjacent to a target frequency, resulting in a further reduced frequency lock time in the first step.

Figure 8:
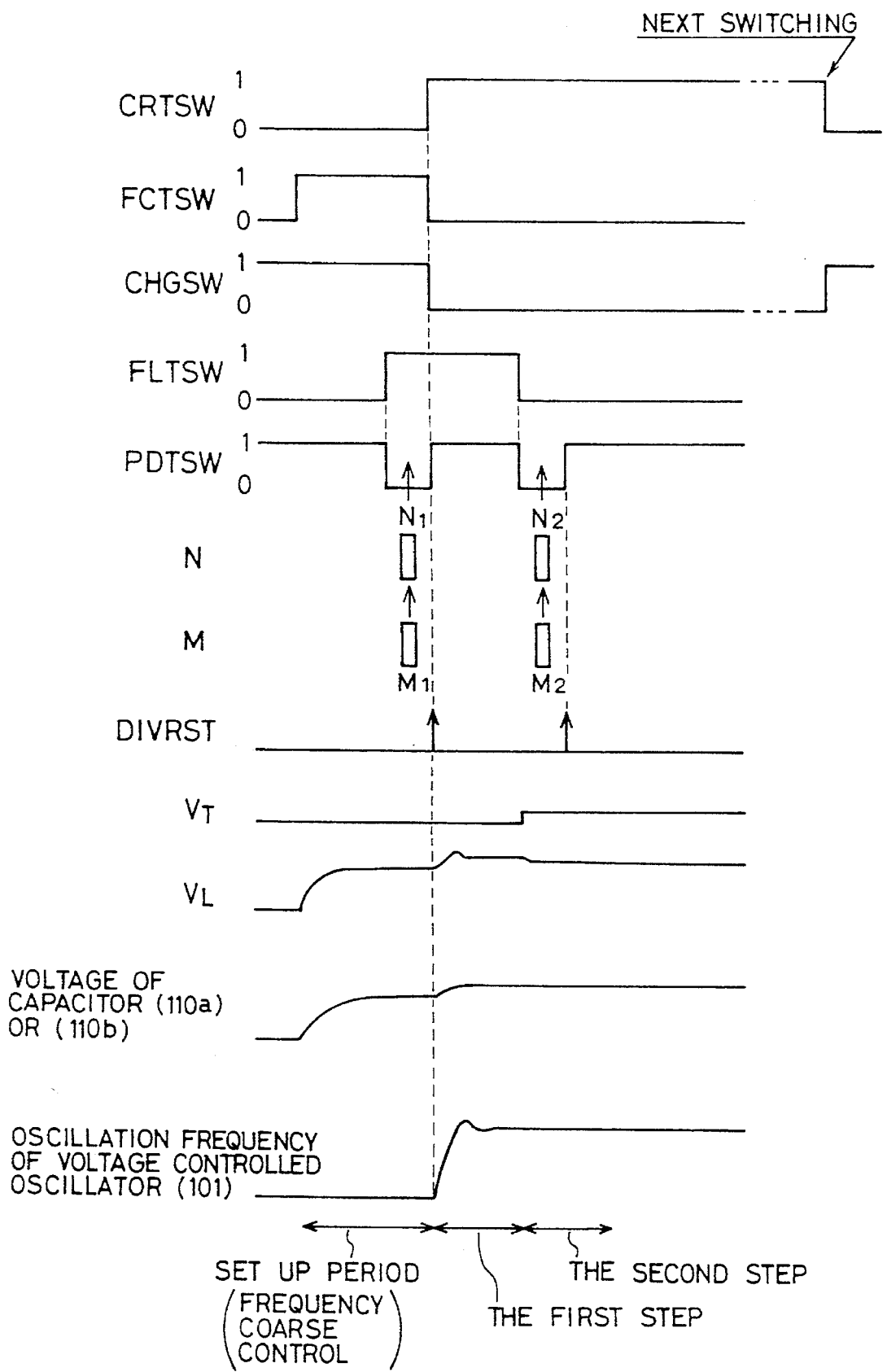
FIG. 8 is a timing diagram showing a signal and a mode of each block portion in FIG. 7.

Referring now to a timing diagram of FIG. 8, a description will be given of the operation. The controller 120 feeds the charging circuit CH with the frequency coarse control data CTV at a starting time of the set up period, and feeds the switch SH with a switch changing signal FCTSW. The set up period is included in a stationary period of previous state. The D-A converter DA converts the frequency coarse control data CTV to the analog signal. Further, the switch SH allows the capacitor 117 to be fed with voltage corresponding to the frequency coarse control signal from the D-A converter DA according to the switch changing signal FCTSW. Thus, it is possible to increase VL to a desired voltage.

The switch 112 selects the capacitor 110a or the capacitor 110b according to a switch changing signal CRTSW. It is assumed that the capacitor 110a is selected. A switch 119 connects the capacitor 110b other than the capacitor 110a selected by the switch 112, to output of the voltage follower 118 according to a switch changing signal CHGSW. Therefore, it is possible to increase potential of the capacitor 110b to a value adjacent to voltage corresponding to the target frequency. In this condition, a phase lock loop includes the second loop filter F2, and the capacitor 110a is employed as a capacitor in the filter. Thus, the capacitor 110a is used in the stationary period before changing frequency starts.

From this condition, the controller 120 reverses polarity of a switch changing signal FLTSW such that the phase lock loop includes the first filter F1 as in the embodiment 1. Accordingly, the first step is started as described in the embodiment 1. In this case, voltage of the capacitor 110b in the second filter F2 has a value adjacent to the voltage corresponding to the target frequency. Therefore, if the capacitor 110b is employed in the second filter F2, it is possible to immediately proceed to the second step using the second filter F2.

The controller 120 reverses polarity of the switch changing signal CRTSW such that the capacitor 110b is used in the second filter F2. Further, polarity of the switch changing signal CHGSW is reversed. Thus, as in the embodiment 1, control in the second step is started.

As set forth above, for the set up period included in the stationary period of previous state, the voltage follower 118 charges the capacitor 110a or 110b which is turned OFF by the switch 112 with the frequency coarse control voltage fed to the capacitor 117. It is thereby possible to previously maintain the voltage of the capacitor 110a or 110b to the voltage corresponding to the frequency adjacent to the target frequency. As a result, it is possible to reduce a time required for transient response from the capacitor in the second loop filter F2 in the first step, resulting in sufficiently reduced time required for the first step.

While preferred embodiments of the invention have been described using specific terms, such description is for illustrative purposes only, and it is to be understood that changes and variations may be made without departing from the spirit or scope of the following claims.

What is claimed is:

1. A phase lock loop frequency synthesizer having means for changing loop oscillation frequency in first and second steps, said frequency synthesizer comprising:

a voltage controlled oscillator for outputting a frequency corresponding to control input voltage;

a comparison frequency divider for dividing the output frequency of said voltage controlled oscillator in a set ratio;

a reference frequency divider for dividing the reference frequency having high stability in a set ratio;

a phase comparator for comparing phases of respective output from said reference frequency divider and said comparison frequency divider;

a charging pump circuit for converting the output from said phase comparator to an analog signal;

a first loop filter having a capacitor connectible with the output of said charging pump circuit to charge said capacitor in the first step of frequency changing, and for outputting the charge voltage of said capacitor as a control voltage to a frequency control terminal of said voltage controlled oscillator;

a second loop filter having a capacitor and including means for introducing said output of said charging pump circuit so as to output a control voltage to said frequency control terminal of said voltage controlled oscillator in the second step of frequency changing;

a charging/discharging circuit for charging/discharging the capacitor of said second loop filter according to said control voltage from said first loop filter in said first step; and a controller for varying a control voltage to a frequency fine control terminal of said voltage controlled oscillator so as to shift oscillation frequency to a target frequency at the starting time of said second step, and for switching over a filter receiving output from said charging pump circuit from said first loop filter to said second loop filter.

2. A phase lock loop frequency synthesizer according to claim 1, wherein said controller sets values for rough frequency adjusting to said dividers at the first step and sets values for fine frequency adjusting to said dividers at a starting time of said second step.

3. A phase lock loop frequency synthesizer according to claim 1, wherein said second loop filter includes two capacitors, said phase lock loop frequency synthesizer further comprising:

a charging circuit to charge said capacitor of said first loop filter to a voltage corresponding to a target frequency in a set up step precedent to said first step; and a connecting circuit to connect output from said charging/discharging circuit to one of said two capacitors of said second loop filter used in said second step in said set up step, and said controller selecting the other of said two capacitors and charging/discharging the selected capacitor.

4. A phase lock loop frequency synthesizer according to claim 3, wherein said controller sets values for rough frequency adjusting to said dividers at the first step and sets values for fine frequency adjusting to said dividers at a starting time of said second step.

* * * * *